(12) United States Patent
Aravamudhan et al.

(10) Patent No.: US 10,573,580 B2
(45) Date of Patent: Feb. 25, 2020

(54) SURFACE STRUCTURE METHOD AND APPARATUS ASSOCIATED WITH COMPUTE OR ELECTRONIC COMPONENT PACKAGES

(71) Applicant: Intel Corporation, Santa Clara, CA (US)

(72) Inventors: Srinivasa R. Aravamudhan, Beaverton, OR (US); Christopher D. Combs, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 15/476,130

(22) Filed: Mar. 31, 2017

(65) Prior Publication Data

US 2018/0288877 A1 Oct. 4, 2018

(51) Int. Cl.
*H01L 23/52* (2006.01)
*H01L 23/488* (2006.01)
*H05K 3/34* (2006.01)

(52) U.S. Cl.
CPC ......... *H01L 23/488* (2013.01); *H05K 3/3463* (2013.01)

(58) Field of Classification Search
CPC .... H05K 1/181; H05K 3/3494; H05K 3/3478; H05K 3/3463; H05K 1/111; H05K 2201/10159; H05K 2201/094; H05K 2201/0939; H05K 2201/10734; H05K 2201/10636
See application file for complete search history.

(56) References Cited

U.S. PATENT DOCUMENTS

| | | | |
|---|---|---|---|
| 2011/0140271 A1* | 6/2011 | Daubenspeck | ... H01L 23/49816 257/738 |
| 2014/0160127 A1* | 6/2014 | Sundaram | ............... G06T 17/10 345/424 |
| 2016/0372433 A1* | 12/2016 | Shi | ......................... H01L 25/105 |
| 2017/0141072 A1* | 5/2017 | Barwicz | .................. H01L 24/81 |

FOREIGN PATENT DOCUMENTS

JP 200583779 * 3/2005 ............. G01C 19/56

* cited by examiner

*Primary Examiner* — Steven H Loke
*Assistant Examiner* — Samuel Park
(74) *Attorney, Agent, or Firm* — Schwabe, Williamson & Wyatt, P.C.

(57) ABSTRACT

Apparatus and method associated with surface structures of compute component packages are disclosed herein. In embodiments, an apparatus may include a plurality of structures provided on a surface of a compute component package, wherein the plurality of structures are to be used to attach and electrically couple the compute component package to another device, and wherein a structure of the plurality of structures includes first and second portions, the second portion disposed further from the surface than the first portion, and the first portion to comprise a material different from the second portion.

7 Claims, 8 Drawing Sheets

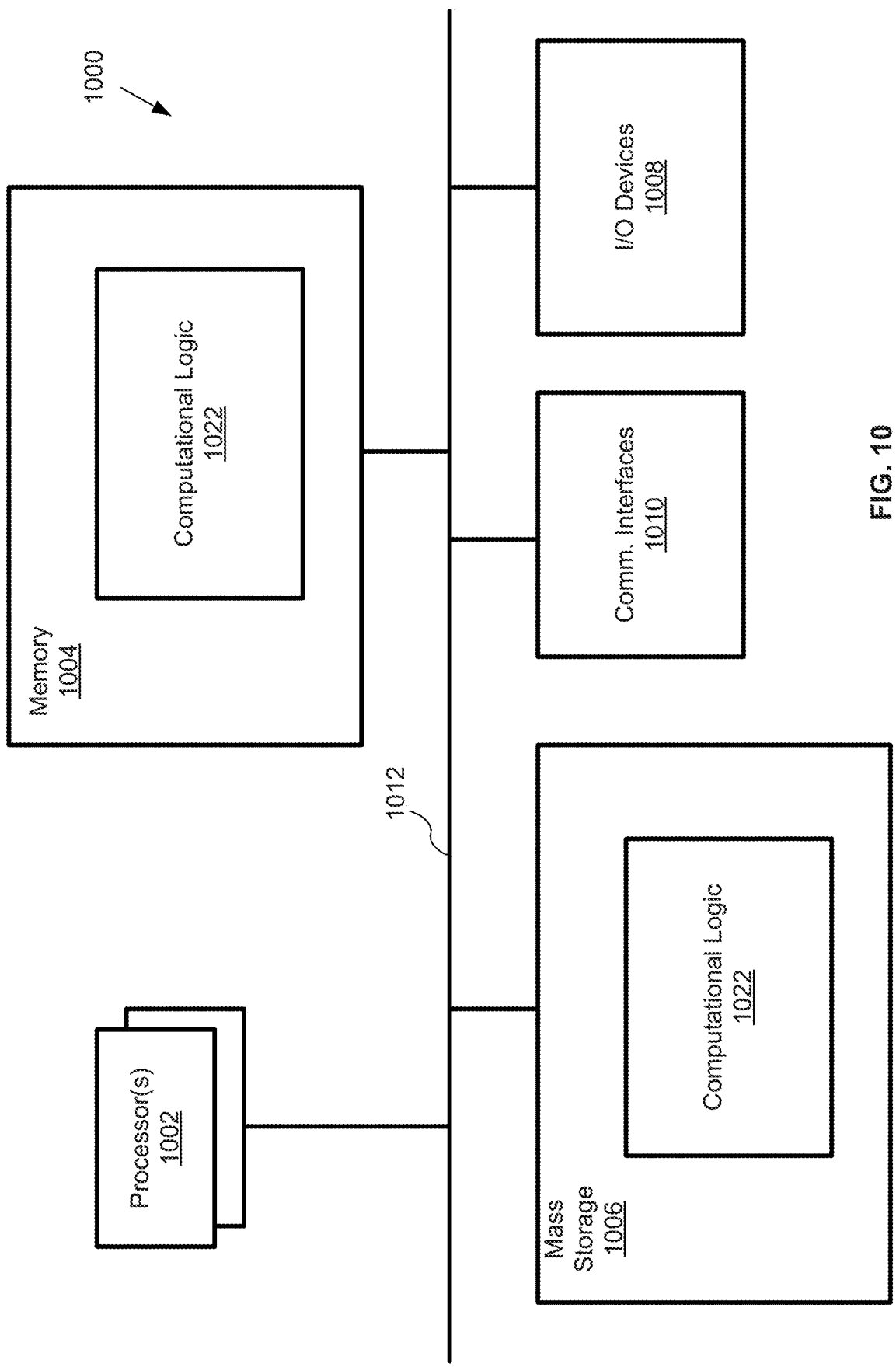

SURFACE STRUCTURE METHOD AND APPARATUS ASSOCIATED WITH COMPUTE OR ELECTRONIC COMPONENT PACKAGES

FIELD OF THE INVENTION

The present disclosure relates generally to the technical fields of computing, and more particularly, to electrical connection structures associated with compute or electronic component packages.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

Compute or electronic component packages may include a plurality of surface mount structures, such as solder or lead structures, to mechanically and electrically connect packages to printed circuit boards (PCBs), substrates, and the like. The size and shape of the plurality of surface mount structures may be standardized. However, there may be instances where different configuration of one or more surface mount structures of the plurality of surface mount structures may be required. There may also be instances where the entity that manufactures and/or assembles the compute/electronic component packages may be different from the entity that assembles the packages with the PCBs, substrates, and the like. Other compute/electronic devices that may include surface mount structures may likewise have different configuration needs that those in existing devices.

BRIEF DESCRIPTION OF THE DRAWINGS

Embodiments will be readily understood by the following detailed description in conjunction with the accompanying drawings. The concepts described herein are illustrated by way of example and not by way of limitation in the accompanying figures. For simplicity and clarity of illustration, elements illustrated in the figures are not necessarily drawn to scale. Where considered appropriate, like reference labels designate corresponding or analogous elements.

FIG. 10 illustrates an example computer device suitable for use to practice aspects of the present disclosure, according to some embodiments.

DETAILED DESCRIPTION

Figure 1:
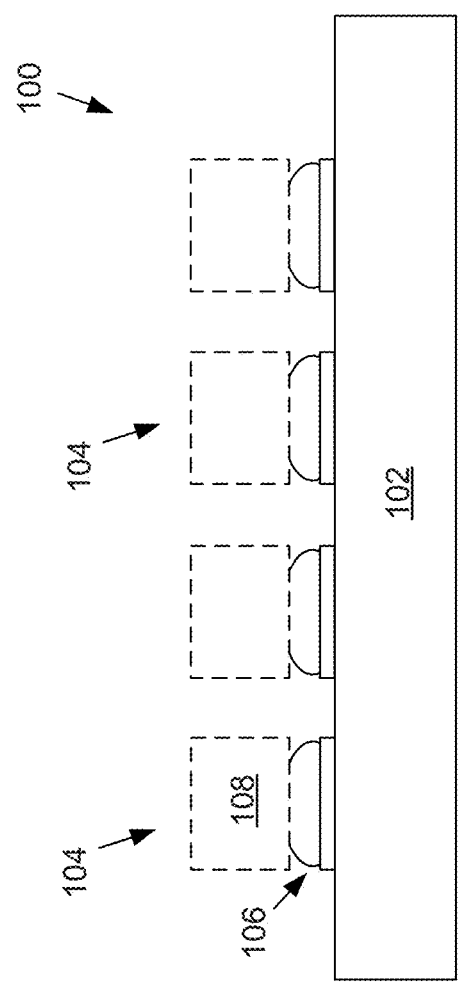
FIG. 1 depicts an example cross sectional view of a plurality of surface mount structures associated with a compute or electronic component incorporating aspects of the present disclosure, according to some embodiments.

Embodiments of apparatuses and methods related to surface structures of compute component packages are described. In embodiments, an apparatus may include a plurality of structures provided on a surface of a compute component package, wherein the plurality of structures are to be used to attach and electrically couple the compute component package to another device, and wherein a structure of the plurality of structures includes first and second portions, the second portion disposed further from the surface than the first portion, and the first portion to comprise a material different from the second portion. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

FIG. 1 depicts an example cross sectional view of a plurality of surface mount structures associated with a compute or electronic component incorporating aspects of the present disclosure, according to some embodiments. An apparatus 100 may include, without limitation, a base or substrate 102 and a plurality of surface mount structures 104 disposed on the base 102. In some embodiments, base 102 may comprise a compute or electronic component, a part of a compute or electronic component, and/or a component associated with a compute or electronic component. Examples of compute or electronic components (also referred to as compute components) may comprise, without limitation, processors, central processing units (CPUs), graphic processing units (GPUs), memory, controllers, interfaces, circuity, integrated circuit chips, printed circuit boards (PCBs), motherboards, chipsets, wireless devices, and the like. Apparatus 100 may also be referred to as a compute or electronic component package, component package, or package.

The plurality of surface mount structures 104 may comprise a plurality of conductive or metallic structures disposed at particular locations at a surface or side of the base 102. The plurality of surface mount structures 104 may be configured on the base 102 so as to mechanically attach and electrically couple to respective mount/electrical coupling structures, for example, on a PCB, motherboard, or device. Upon such connection with the PCB, motherboard, etc., electrical coupling of the compute component associated with the surface mount structures 104 may also be established with the PCB, motherboard, etc. via the surface mount structures 104. The surface mount structures 104 may be, for example, arranged in an array pattern on the base 102, along a perimeter of the base 102, in the middle of the base 102, along one or more edges of the base 102, or any other pattern to correspond with mount structures associated with the PCB, motherboard, and the like.

In some embodiments, a surface mount structure of the plurality of surface mount structures 104 may include at least a first portion 106 and a second portion 108, in which the first portion 106 may be disposed between the second portion 108 and the base 102. The first and second portions 106, 108 may be physically attached and electrically coupled to each other. In some embodiments, the height of the surface mount structure 104 may be greater than its width or diameter, or in particular, the width or diameter of the first portion 106; the material comprising the first portion 106 may be different from the material comprising the second portion 108; and/or the shape of the first portion 106 may be different from the shape of the second portion 108.

In some embodiments, first portion 106 and second portion 108 may have a metallurgy composition different from each other. For example, first portion 106 may comprise a tin-silver-copper (SnAgCu) (SAC) alloy, and second portion 108 may comprise SAC alloy with a tin-copper-bismuth (SnCuBi) intermetallic. The SnCuBi intermetallic (also referred to as a SnCuBi intermetallic joint or solder joint) may be located at or near the interface between the first and second portions 106, 108. As another example, first portion 106 may comprise a tin-copper (SnCu) alloy, and second portion 108 may comprise SnCu alloy with a SnCuBi intermetallic. In still another example, first portion 106 may comprise SAC alloy and second portion 108 may comprise SnCu alloy with an intermetallic compound different from SnCu alloy. In yet another example, first portion 106 may comprise SnCu alloy and second portion 108 may comprise SAC alloy with an intermetallic compound different from SAC alloy. In other examples, first portion 106 may comprise lead free solder material and second portion 108 may comprise lead free solder material and an area of the second portion 108 comprising a material different from the lead free solder material.

In some embodiments, first and second portions 106, 108 may have a melting temperature greater than approximately 175 degrees Celsius, melting temperature greater than approximately 200 degrees Celsius, or melting temperature of approximately 245 degrees Celsius. In some embodiments, a portion of the second portion 108 (e.g., the intermetallic portion mentioned above) may have a melting temperature that is different from that of the first portion 106 and/or the rest of the second portion 108 (e.g., a lower melting temperature).

The first portion 106, in some embodiments, may comprise a bump, lead, ball, pad, or solder associated with the apparatus 100 configured as a ball grid array (BGA) package, quad flat no lead (QFN) package, leadless chip carrier (LCC) package, or the like. The second portion 108 may comprise a supplemental bump, lead, ball, pad, or solder added to modify the apparatus 100, as described in detail below. In some embodiments, the apparatus 100 without the second portions 108 may comprise an initial compute/electronic component package capable of being attached to some PCBs or motherboards. However, such a structure may be augmented or modified by the inclusion of the second portions 108. The first and second portions 106, 108 together may thus comprise a resultant surface mount structure 104 having a geometry, shape, height, width, and/or configuration different from that of the first portion 106 provided alone as a surface mount structure of the apparatus 100. The surface mount structures 104 may also be referred to as modified surface mount structures, modified surface mount and electrical connection structures, and the like.

Figure 8:
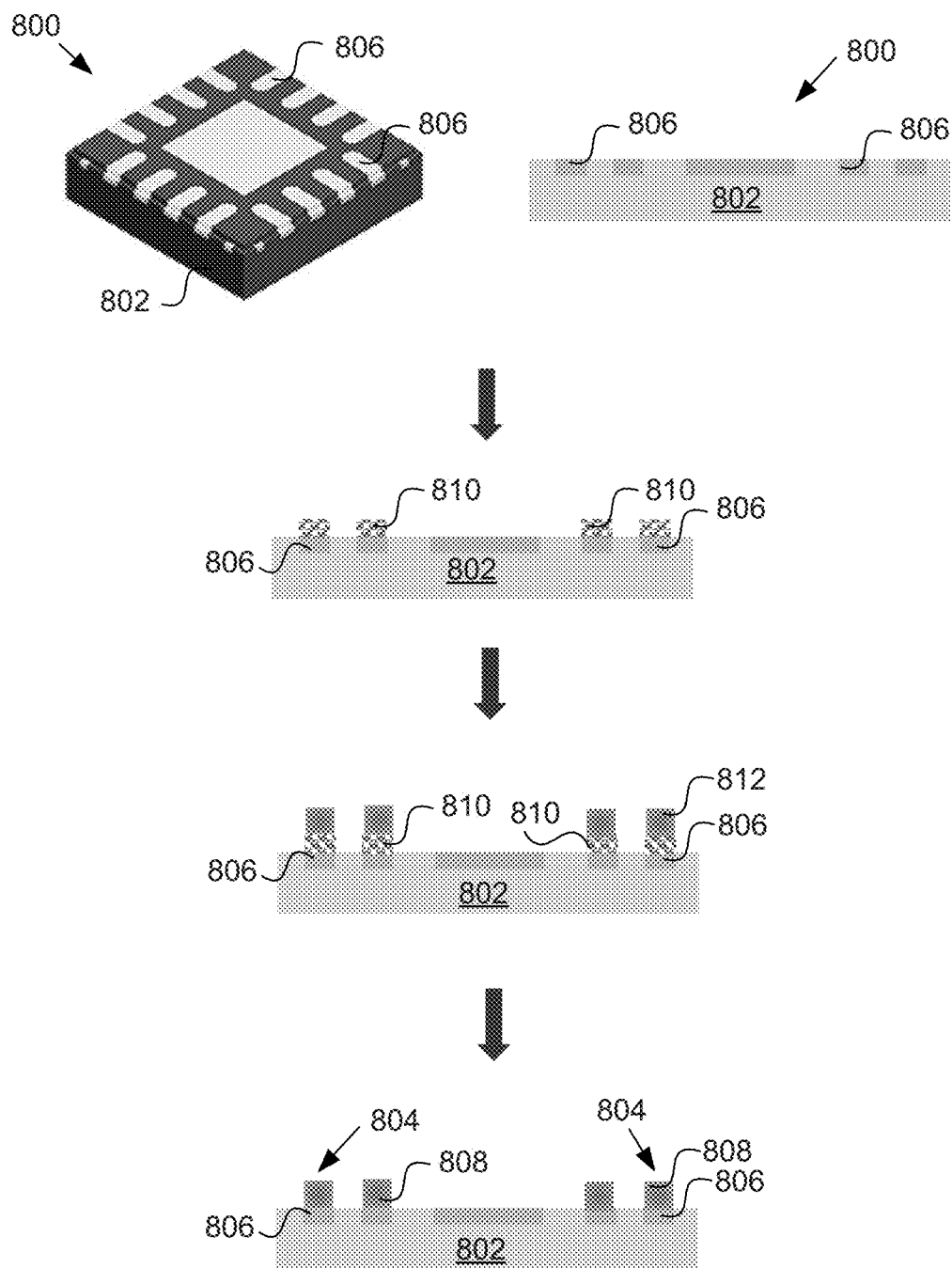
FIG. 8 depicts example views of various stages of formation of surface mount structures associated with a QFN package in accordance with the process of FIG. 3, according to some embodiments.
Figure 9:
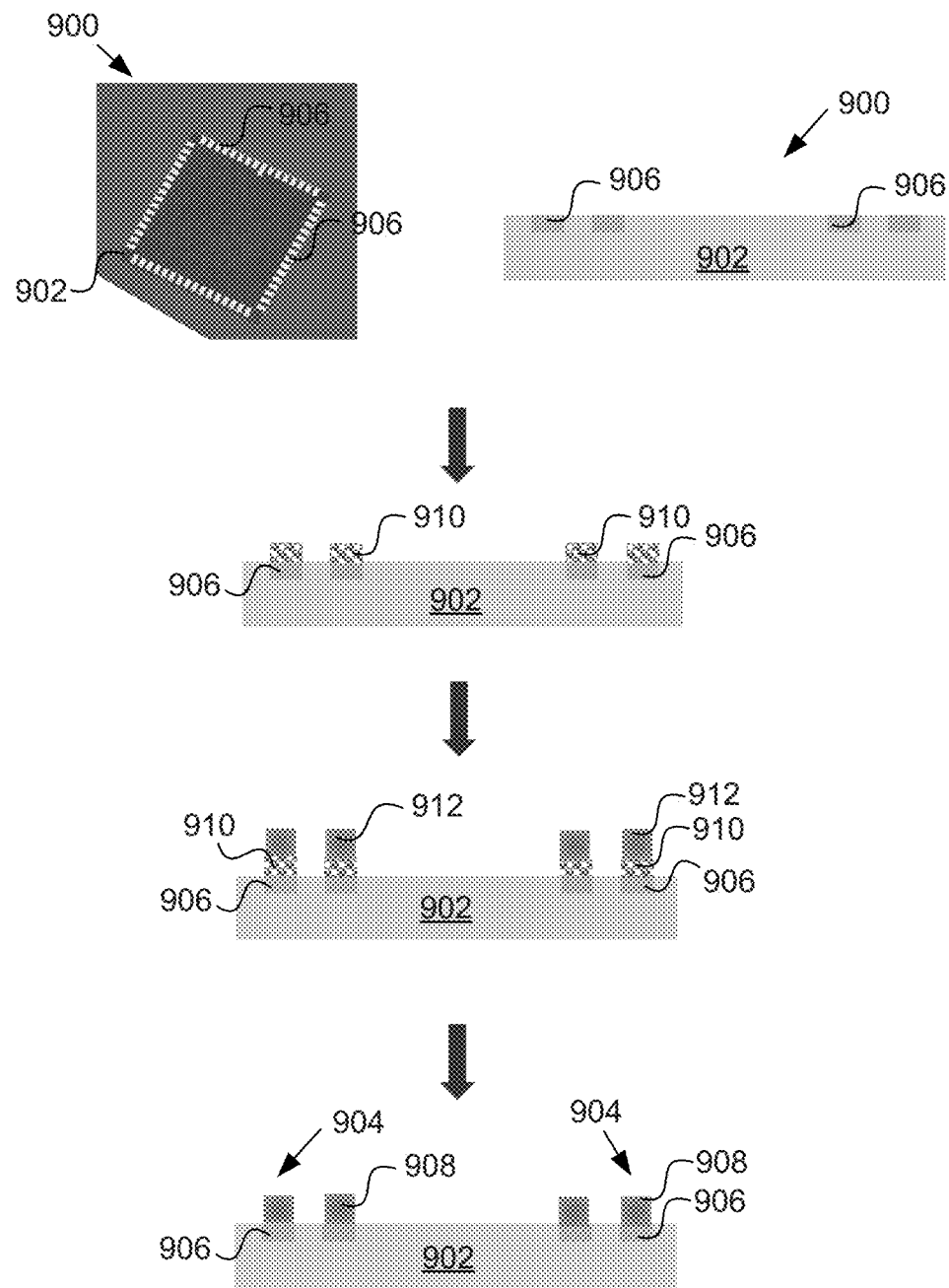
FIG. 9 depicts example views of various stages of formation of surface mount structures associated with a LCC package in accordance with the process of FIG. 3, according to some embodiments.

When, for example, the apparatus 100 comprises a BGA package, first portion 106 may comprise a spherical or semi-spherical shape, as shown in FIG. 1. When the apparatus 100 comprises a QFN or LCC package, first portion 106 may comprise a flat lead, in which the side of the lead furthest from the base 102 may be even with or collinear with the side of the base 102 closest to the surface mount structures 104, as shown in FIGS. 8-9.

Figure 2C:
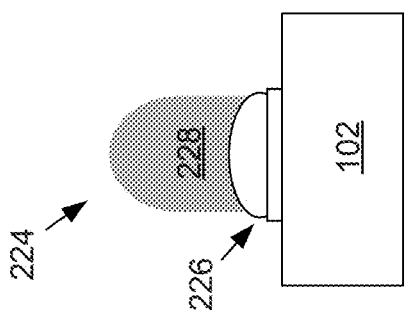
FIGS. 2A-2E depict example illustrations of various embodiments of the surface mount structures, according to some embodiments.
Figure 2B:
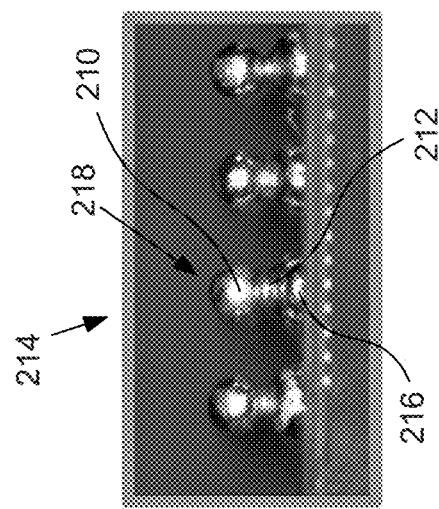
Figure 2E:
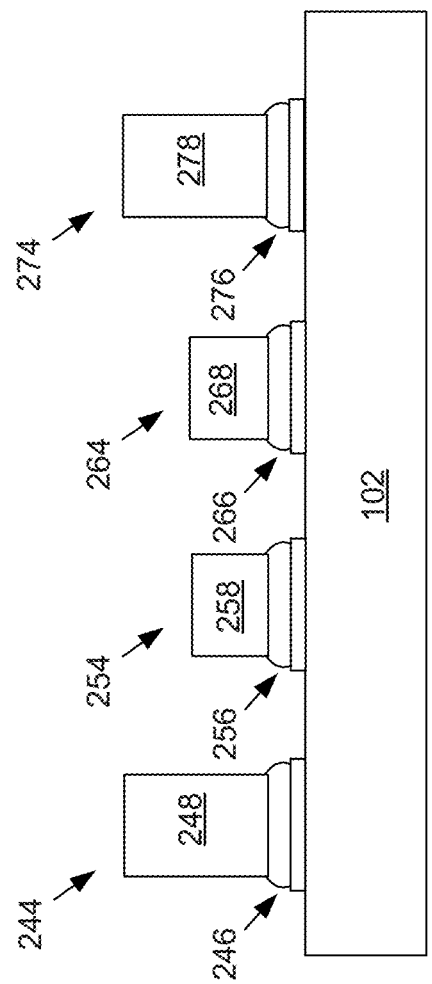
Figure 2A:
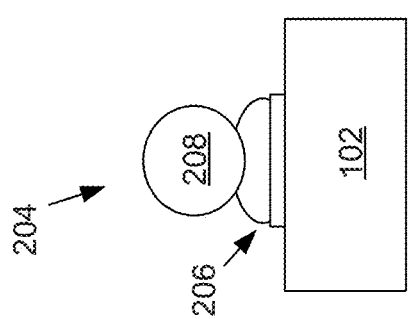

FIGS. 2A-2E depict example illustrations of various embodiments of the surface mount structures 104, according to some embodiments. FIG. 2A depicts the surface mount structure 104 configured as a surface mount structure 204 having a snowman geometry or profile, according to an embodiment. Surface mount structure 204 may include first and second portions 206, 208, with the first portion 206 disposed between the second portion 208 and the base 102. First portion 206 may be similar to first portion 106. Second portion 208 may comprise a spherical or substantially spherical shape. When the first portion 206 comprises a ball, spherical, or semi-spherical shape, such as in a BGA package, first and second portions 206, 208 may in combination resemble a snowman shape.

FIG. 2B depicts the surface mount structure 104 which may be configured as a surface mount structure 214 having an alternative snowman geometry or profile, according to another embodiment. Surface mount structure 214 may include first and second portions 216, 218, with the first portion 216 disposed between the second portion 218 and the base 102. First portion 216 may be similar to first portion 206. Second portion 218 may include a spherical portion 210 and a cylindrical/columnar portion 212. The cylindrical portion 212 may be disposed between the spherical portion 210 and the first portion 216. Cylindrical portion 212 may comprise an example of the intermetallic compound included in the second portion 218. The spherical portion 210 may be similar to second portion 208, and the cylindrical portion 212 may have a width (or diameter) smaller than that of first portion 216 and/or spherical portion 210. Cylindrical portion 212 may also be referred to as a collar, band, or neck portion of the snowman geometry of surface mount structure 214.

FIG. 2C depicts the surface mount structure 104 configured as a surface mount structure 224 having a columnar geometry or profile, according to yet another embodiment. Surface mount structure 224 may include first and portions 226, 236, in which the first portion 226 may be disposed between the second portion 228 and the base 102. First portion 226 may be similar to first portion 206. Second portion 228 may comprise a cylindrical, columnar, or other shape providing height to the surface mount structure 224 in a direction perpendicular to the base 102. In some embodiments, surface mount structure 224 may be taller than surface mount structure 204 and/or 214.

Figure 2D:
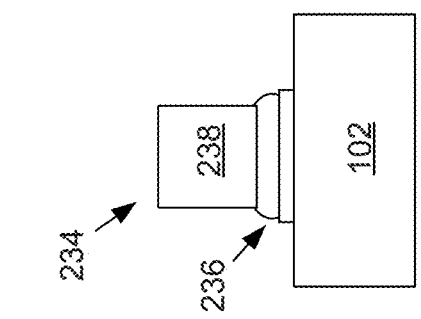

FIG. 2D depicts the surface mount structure 104 configured as a surface mount structure 234 having a polygonal geometry or profile, according to still another embodiment. Surface mount structure 234 may include first and second portions 236, 238, in which the first portion 236 may be disposed between the second portion 238 and base 102. First portion 236 may be similar to first portion 206. The second portion 238 may comprise a three-dimensional polygon, triangle based shape, square based shape, rectangle based shape, octagon based shape, rectangular prism, cube, tetrahedron, triangular prism, octagonal prism, square pyramid, non-spherical based shape, non-oval based shape, and the like. In some embodiments, use of non-spherical shapes may permit surface mount structure array patterns that may improve circuit board electrical trace breakout and/or pitch density (e.g., higher pitch).

FIG. 2E depicts the surface mount structures 104 configured as surface mount structures 244, 254, 264, 274 having different heights from each other, according to some embodiments. Surface mount structures 244, 254, 264, 274 may include respective first and second portions 246, 248; 256, 258; 266, 268; 276, 278, in which first portions 246, 256, 266, 276 may be disposed between respective second portions 248, 258, 268, 278 and base 102. At least one of surface mount structures 244, 254, 264, 274 may have a height different from another of the surface mount structures 244, 254, 264, 274. For example, surface mount structures 244, 274 may be taller than surface mount structures 254, 264. Different surface mount structure heights of a package may accommodate coupling the package to height varying PCBs or motherboards, such as PCBs or motherboards with cavities. Alternatively, one or more of surface mount structures 244, 254, 264, 274 may vary in shape/geometry/profile from each other. For example, surface mount structure 244 may comprise a snowman geometry as in FIG. 2A, surface mount structure 254 may comprise a columnar/cylindrical geometry as in FIG. 2C, and surface mount structure 264 may comprise a three dimensional polygonal geometry as in FIG. 2D.

In alternative embodiments, one or more adjacent surface mount structures 104 may be connected to each other (e.g., ganged or bridged solder) to improve electrical connections. For instance, the second portion 108 of a first surface mount structure and the second portion 108 of a second surface mount structure may be mechanically and/or electrically coupled to each other so as to span across first portions 106 associated with the first and second surface mount structures.

Figure 3:
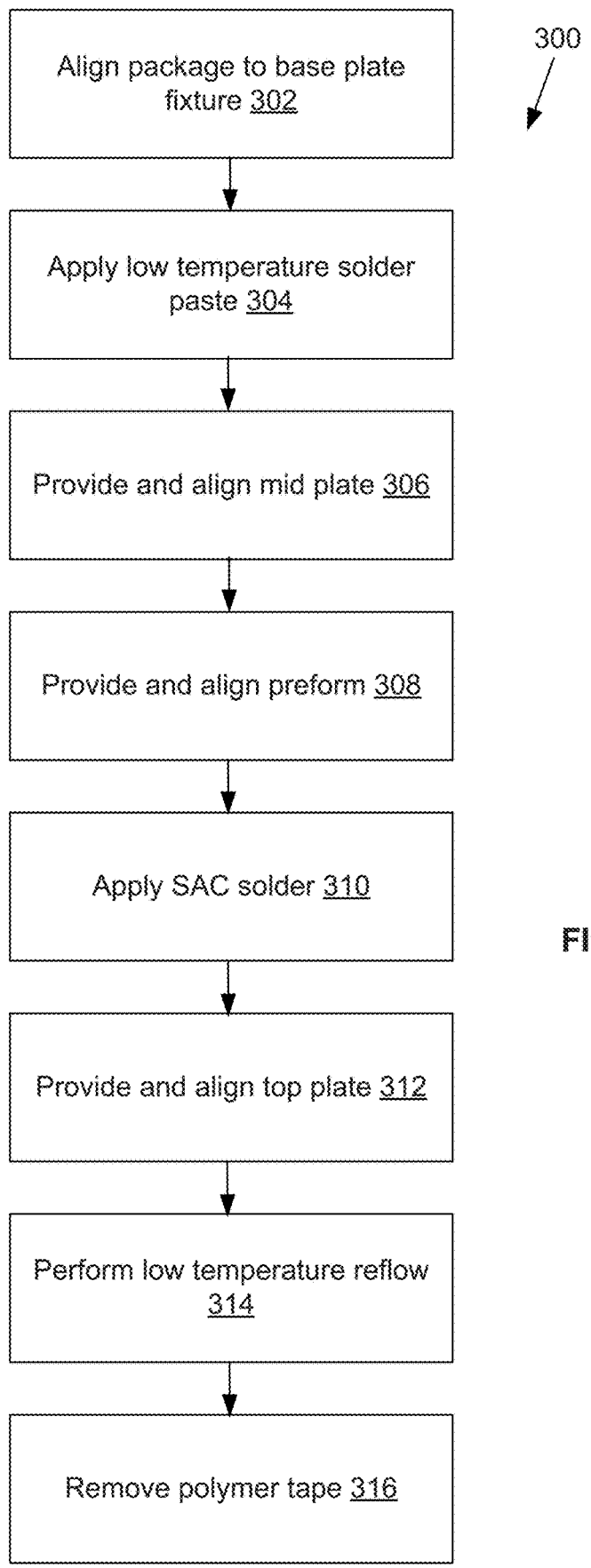
FIG. 3 depicts an example process for forming the surface mount structures, according to some embodiments.
Figure 4:
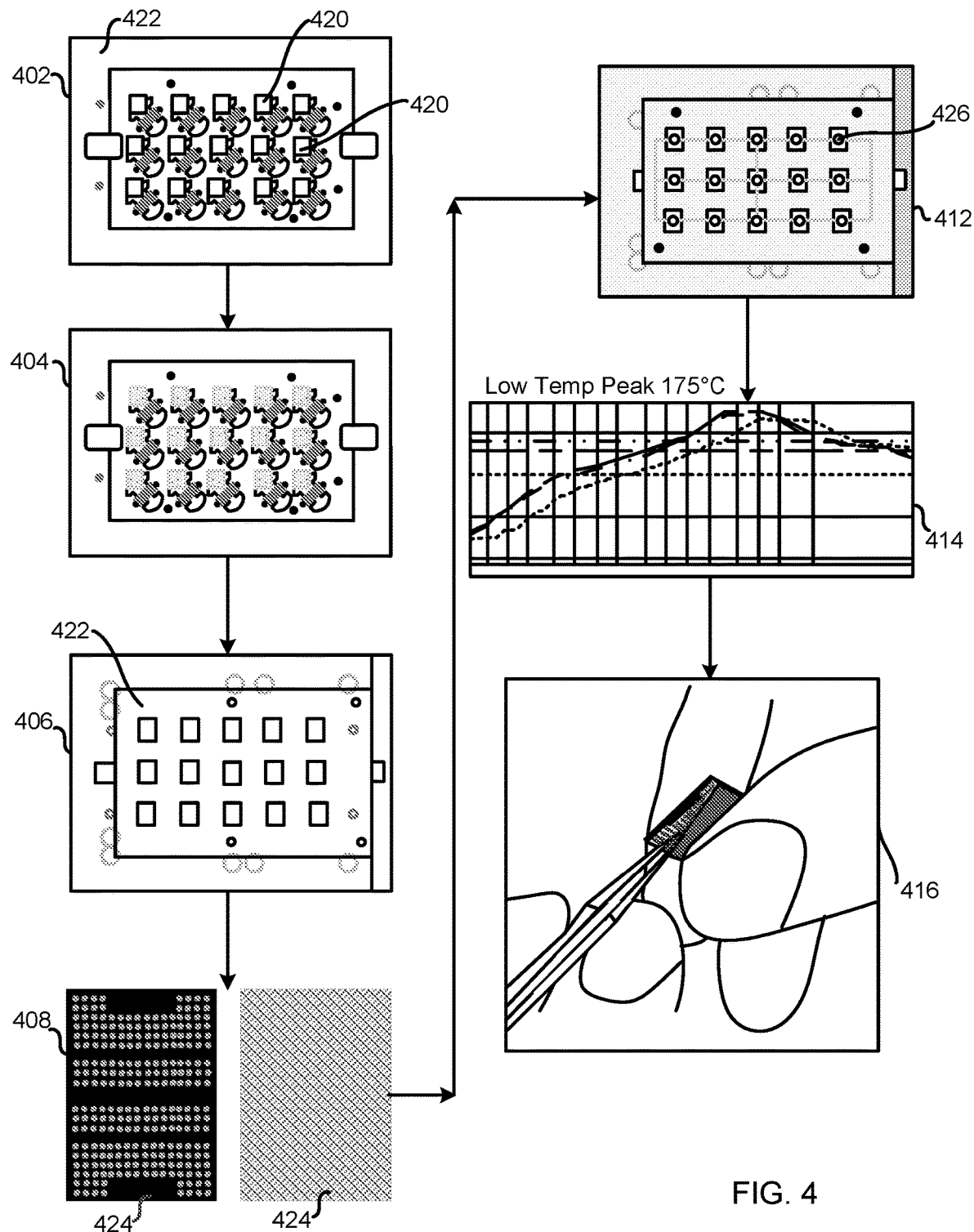
FIG. 4 depicts example images associated with formation of the surface mount structures in accordance with the process of FIG. 3, according to some embodiments.

FIG. 3 depicts an example process 300 for forming the surface mount structures 104, according to some embodiments. At a block 302, apparatus 100 including first portions 106 (also referred to as existing or initial surface mount structures) but not the second portions 108 may be placed into, aligned with, or seated in a base plate fixture. The base plate fixture may comprise a tray or holder of the apparatus 100. The first portions 106 of the apparatus 100 may be facing upward or furthest from the base plate fixture. As an example, image 402 in FIG. 4 shows a plurality of compute/electronic component packages 420, any which of may comprise the apparatus 100 including first portions 106 and excluding second portions 108, aligned with a base plate fixture 422.

Next at a block 304, a low temperature solder paste may be applied over the first portions 106. In some embodiments, low temperature solder paste may comprise solder paste having a melting temperature below approximately 200 degrees Celsius. For example, low temperature solder paste may comprise a tin-bismuth (SnBi) (Sn42Bi58) alloy having a melting temperature of approximately 138 degrees Celsius. The thickness of the layer of low temperature solder paste applied may be in the range of approximately 100 microns. Low temperature solder paste may be applied using a printing technique, a spray technique, or the like. Continuing the example, image 404 in FIG. 4 shows the structure shown in image 402 after application of the low temperature solder paste.

At block 306, a mid plate (such as a mid plate 422 shown in image 406 of FIG. 4) may be placed over the applied low temperature solder paste. The mid plate may include a plurality of cutout areas or holes, each cutout area corresponding to a respective compute/electronic component package of the plurality of compute/electronic component packages 420. The mid plate may facilitate alignment of preforms to be placed over select areas of the applied low temperature solder paste in a block 308.

In some embodiments, a preform (such as preform 424 shown in image 408 of FIG. 4) may be placed in each cutout area of the mid plate, at block 308. The preform may comprise a plate with a plurality of cutout areas or holes, each cutout area to align with the location of a respective surface mount structure (e.g., first portion 106) of the compute/electronic component package 420 located below. Two opposing sides of the preform 424 may be as shown in image 408. The shape and size of the preform cutout areas may be selected in accordance with the desired shape and dimensions of the second portions 108. For example, when the surface mount structures 104 are to comprise snowman geometry, each of the preform cutout areas may comprise a circle shape having a particular diameter. As another example, when the surface mount structures 104 are to comprise a triangular based shape (e.g., tetrahedron, square pyramid), then the preform cutout areas may comprise a triangle shape.

The shape and/or dimensions of a first cutout area of a first preform may or may not be the same as a second cutout area of the first preform. Similarly, the shape and/or dimensions of a cutout area of a first preform may or may not be the same as a cutout area of a second preform.

Next, at a block 310, metallic solder having a melting temperature above approximately 175 degrees Celsius or 200 degrees Celsius (e.g., SAC alloy, lead free material, SnCu alloy, etc.) may be applied or placed in the cutout areas of the preform provided in block 308. The applied metallic solder may be disposed above (and in contact) with the low temperature solder paste applied in block 304.

In some embodiments, a top plate (such as top plate 426 shown in image 412 of FIG. 4) may be placed over the applied metallic solder, at a block 412. The top plate may provide weight or a compressive force to facilitate adhesion and/or shaping of the metallic solder, low temperature solder paste, and the first portions 106 to each other. Then at a block 314, a low temperature reflow operation may be performed, in which at least the first portions 106, the low temperature solder paste, and metallic solder may be exposed to a temperature of up to approximately 175 degrees Celsius, or up to approximately 200 degrees Celsius, to form surface mount structures comprising more than just the first portions 106, such as surface mount structures 104, 204, 214, 224, 234, 244, 254, 264, and/or 274 or the like.

The applied temperature (e.g., having a temperature profile as shown in image 414 of FIG. 4) may cause at least the low temperature solder paste disposed between a first portion 106 and the metallic solder to (partially) melt or reflow to connect the first portion 106 to the metallic solder. The low temperature solder paste may diffuse into the applied metallic solder to form an intermetallic compound, at least at or near the interface between the first portion 106 and the metallic solder. For example, when the low temperature solder paste comprises SnBi (Sn42Bi58) alloy suspended in an aqueous medium (or flux) and the applied metallic solder comprises SAC alloy, reflow operation may cause the aqueous medium to dissipate (e.g., evaporate) and the Sn and Bi of the low temperature solder paste to diffuse to or interact with the SAC alloy to form a Sn—Cu—Bi intermetallic compound. As another example, when the low temperature solder paste comprises SnBi (Sn42Bi58) alloy suspended in an aqueous medium (or flux) and the applied metallic solder comprises SnCu alloy, reflow operation may cause formation of a Sn—Cu—Bi intermetallic compound, at a different copper concentration level than that of if the applied metallic solder comprises SAC alloy. The applied temperature may also facilitate or cause the metallic solder to form into the particular shape and/or dimensions of the second portion 108. In some embodiments, the reflow conditions may be selected to avoid changing or minimize changing the first portions 106. Accordingly, reflow operation may convert the low temperature solder paste (or a portion thereof) and the applied metallic solder material into the second portions 108.

Lastly, at a block 316, one or more post reflow operations may be performed, such as removal of polymer tape used during the manufacturing process (e.g., such as shown image 416 of FIG. 4), to complete formation of modified/augmented surface mount structures of existing compute/electronic component packages.

Figure 5:
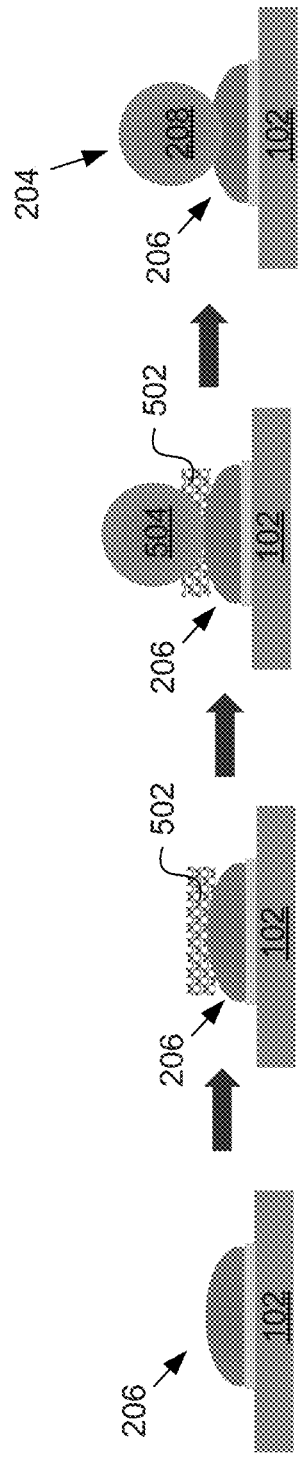
FIGS. 5-7 depict example views of various stages of the formation of surface mount structures in accordance with the process of FIG. 3, according to some embodiments.
Figure 6:
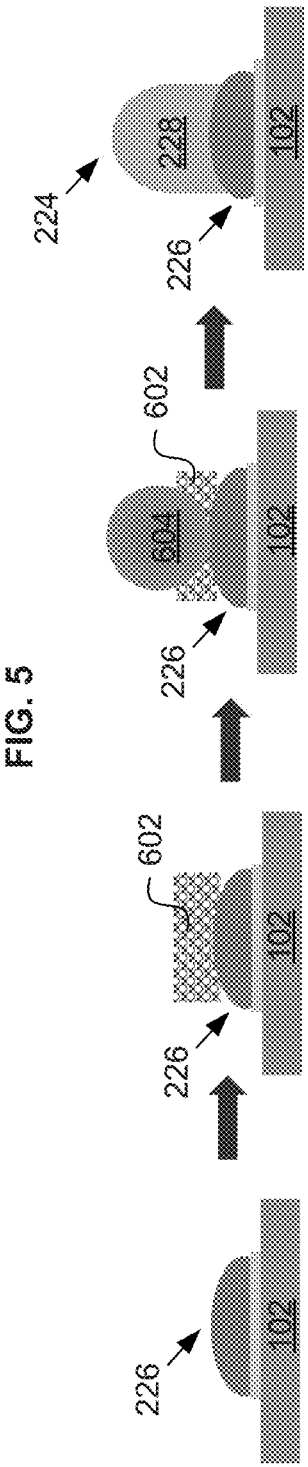
Figure 7:
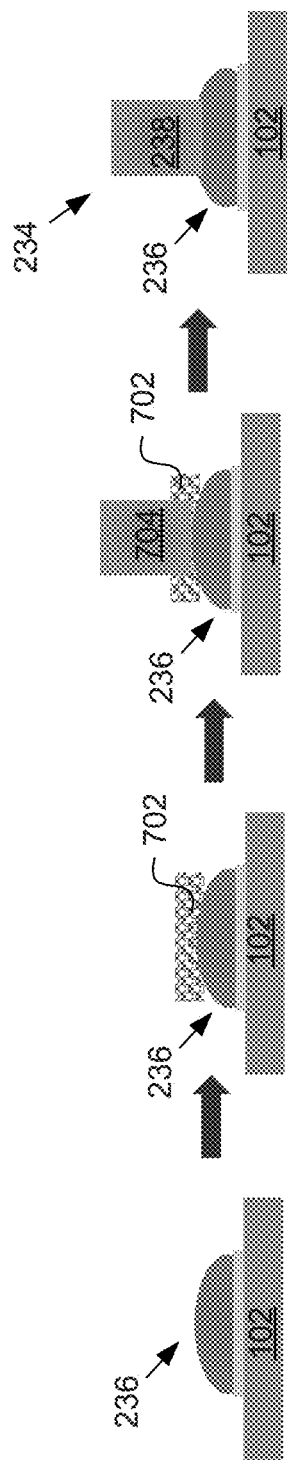

FIGS. 5-7 depict example views of various stages of the formation of surface mount structures 204, 224, 234 in accordance with process 300, according to some embodiments. In FIG. 5, a layer of low temperature solder paste 502 may be provided on a side of the first portion 206 furthest from the base 102. At a side of the low temperature solder paste 502 furthest from the first portion 206 may be provided a SAC solder 504. After the reflow operation of block 314, the surface mount structure 204 comprising a spherical shaped second portion 208 and having an overall snowman geometry or shape may be formed. FIGS. 6 and 7 similarly show a layer of low temperature solder paste 602 between first portion 226 and a SAC solder 604 and a layer of low temperature solder paste 702 between first portion 236 and a SAC solder 704, respectively, to form surface mount structures 224 and 234, respectively.

FIG. 8 depicts example views of various stages of formation of surface mount structures 804 associated with a QFN package 800 in accordance with process 300, according to some embodiments. The QFN package 800 may include a base 802 and a plurality of first portions 806, which may comprise flat leads or electrical connection areas of the QFN package that are flush with the top surface of the base 802. Low temperature solder paste 810 may be applied to the first portions 806, and SAC solder 812 may be located on a side of the low temperature solder paste 810 furthest from the base 802 (e.g., above the low temperature solder paste 810). With the low temperature solder paste 810 and SAC solder 812 in place, low temperature reflow operation may occur, to form the surface mount structures 804. Each of the surface mount structures 804 may include a second portion 808 that is based on the SAC solder 812 and the first portion 806. The height of the surface mount structure 804 above the top surface of the base 802 may be defined by the height of the second portion 808. The shape of the surface mount structure 804 above the top surface of the base 802 may also be defined by the shape of the second portion 808 (e.g., a polygonal shape such as a square shape).

FIG. 9 depicts example views of various stages of formation of surface mount structures 804 associated with a LCC package 900 in accordance with process 300, according to some embodiments. The LCC package 900 may include a base 902 and a plurality of first portions 906, which may comprise flat leads or electrical connection areas of the LCC package that are flush with the top surface of the base 902. Low temperature solder paste 910 may be applied to the first portions 906, and SAC solder 912 may be located on a side of the low temperature solder paste 910 furthest from the base 902 (e.g., above the low temperature solder paste 910). With the low temperature solder paste 910 and SAC solder 912 in place, low temperature reflow operation may occur, to form the surface mount structures 904. Each of the surface mount structures 904 may include a second portion 908 that is based on the SAC solder 912 and the first portion 906. The height of the surface mount structure 904 above the top surface of the base 902 may be defined by the height of the second portion 908. The shape of the surface mount structure 904 above the top surface of the base 902 may also be defined by the shape of the second portion 908 (e.g., a polygonal shape such as a square shape).

In this manner, a variety of surface mount structure geometries may be achieved in compute/electronic component packages, which may differ from initial or existing surface mount structures associated with the packages, to aid in package performance, reliability, assembly, and/or testing. A variety of non-spherical geometry may be achieved for the surface mount structures.

FIG. 10 illustrates an example computer device 1000 suitable for use to practice aspects of the present disclosure, in accordance with various embodiments. In some embodiments, surface mount structures 104, 204, 214, 224, 234, 244, 254, 264, 274, 804, and/or 904 may be included in the computer device 1000 or portion(s) thereof. For example, processor 1002 may comprise a processor package that includes surface mount structures 104. As shown, computer device 1000 may include one or more processors 1002, and system memory 1004. The processor 1002 may include any type of processors. The processor 1002 may be implemented as an integrated circuit having a single core or multi-cores, e.g., a multi-core microprocessor. The computer device 1000 may include mass storage devices 1006 (such as diskette, hard drive, volatile memory (e.g., DRAM), compact disc read only memory (CD-ROM), digital versatile disk (DVD), flash memory, solid state memory, and so forth). In general, system memory 1004 and/or mass storage devices 1006 may be temporal and/or persistent storage of any type, including, but not limited to, volatile and non-volatile memory, optical, magnetic, and/or solid state mass storage, and so forth. Volatile memory may include, but not be limited to, static and/or dynamic random access memory. Non-volatile memory may include, but not be limited to, electrically erasable programmable read only memory, phase change memory, resistive memory, and so forth.

The computer device 1000 may further include input/output (I/O) devices 1008 such as a microphone, sensors, display, keyboard, cursor control, remote control, gaming controller, image capture device, and so forth and communication interfaces 1010 (such as network interface cards, modems, infrared receivers, radio receivers (e.g., Bluetooth)), antennas, and so forth.

The communication interfaces 1010 may include communication chips (not shown) that may be configured to operate the device 1000 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1010 may operate in accordance with other wireless protocols in other embodiments.

The above-described computer device 1000 elements may be coupled to each other via a system bus 1012, which may represent one or more buses. In the case of multiple buses, they may be bridged by one or more bus bridges (not shown). Each of these elements may perform its conventional functions known in the art. Computational logic 1022 may be implemented by assembler instructions supported by processor(s) 1002 or high-level languages that may be compiled into such instructions. The permanent copy of the programming instructions may be placed into mass storage devices 1006 in the factory, or in the field, through, for example, a distribution medium (not shown), such as a compact disc (CD), or through communication interfaces 1010 (from a distribution server (not shown)).

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

Example 1 is an apparatus including a plurality of structures provided on a surface of a compute component package, wherein the plurality of structures are to be used to attach and electrically couple the compute component package to another device, and wherein a structure of the plurality of structures includes first and second portions, the second portion disposed further from the surface than the first portion, and the first portion to comprise a material different from the second portion.

Example 2 may include the subject matter of Example 1, and may further include wherein the compute component package comprises a ball grid array (BGA) package, a quad flat no lead (QFN) package, or a leadless chip carrier (LCC) package.

Example 3 may include the subject matter of any of Example 1-2, and may further include wherein the first portion comprises tin-silver-copper (SnAgCu) (SAC) alloy and at least a portion of the second portion comprises tin-copper-bismuth (SnCuBi) intermetallic compound.

Example 4 may include the subject matter of any of Example 1-3, and may further include wherein the first portion comprises tin-copper (SnCu) alloy and at least a portion of the second portion comprises tin-copper-bismuth (SnCuBi) intermetallic compound.

Example 5 may include the subject matter of any of Example 1-4, and may further include wherein a height of the structure of the plurality of structures is greater than a width of the structure.

Example 6 may include the subject matter of any of Example 1-5, and may further include wherein a first structure of the plurality of structures is adjacent to a second structure of the plurality of structures, and wherein the first structure has a different height from the second structure.

Example 7 may include the subject matter of any of Example 1-6, and may further include wherein a first structure of the plurality of structures is adjacent to a second structure of the plurality of structures, and wherein the first structure is electrically coupled to the second structure.

Example 8 may include the subject matter of any of Example 1-7, and may further include wherein a shape of the first portion is different from a shape of the second portion.

Example 9 may include the subject matter of any of Example 1-8, and may further include wherein the first portion comprises a spherical, a semi-spherical, or a flat lead shape.

Example 10 may include the subject matter of any of Example 1-9, and may further include wherein the second portion comprises a spherical, a columnar, a cylindrical, a polygonal, a rectangular, a square, or an octagonal shape.

Example 11 is a method including applying a low temperature solder paste over a plurality of first portion structures on a surface of a compute component package; applying solder material over the low temperature solder paste; and performing low temperature reflow on at least the low temperature solder paste, solder material, and the plurality of first portion structures.

Example 12 may include the subject matter of Example 11, and may further include wherein performing low temperature reflow comprises converting the low temperature solder paste and the solder material into a plurality of second portion structures respectively disposed above the plurality of first portion structures.

Example 13 may include the subject matter of any of Examples 11-12, and may further include wherein the low temperature solder paste has a lower melting temperature than the plurality of first portion structure or the solder material or both.

Example 14 may include the subject matter of any of Examples 11-13, and may further include wherein a shape of a first portion structure of the plurality of first portion structures is different from a shape of a second portion structure of the plurality of second portion structures.

Example 15 may include the subject matter of any of Examples 11-14, and may further include wherein a first portion structure of the plurality of first portion structures comprises a spherical, a semi-spherical, or a flat lead shape.

Example 16 may include the subject matter of any of Examples 11-15, and may further include wherein a second portion structure of the plurality of second portion structures comprises a spherical, a columnar, a cylindrical, a polygonal, a rectangular, a square, or an octagonal shape.

Example 17 may include the subject matter of any of Examples 11-16, and may further include wherein performing low temperature reflow comprises attaching the plurality of first portion structures to respective plurality of second portion structures, and wherein the plurality of first portion structures attached to respective plurality of second portion structures comprise a plurality of surface mount and electrical coupling structures of the compute component package.

Example 18 may include the subject matter of any of Examples 11-17, and may further include wherein at least a part of a second portion structure of the plurality of second portion structures comprises tin-copper-bismuth (Sn—Cu—Bi) intermetallic compound.

Example 19 may include the subject matter of any of Examples 11-18, and may further include wherein applying the solder material comprises applying tin-silver-copper (SnAgCu) (SAC) alloy, tin-copper (SnCu) alloy, or lead free solder material over the low temperature solder paste.

Example 20 may include the subject matter of any of Examples 11-19, and may further include wherein performing low temperature reflow comprises performing the low temperature reflow at a temperature less than or equal to approximately 200 degrees Celsius.

Example 21 may include the subject matter of any of Examples 11-20, and may further include wherein the plurality of first portion structures have a melting temperature above 175 degrees Celsius.

Example 22 may include the subject matter of any of Examples 11-21, and may further include wherein the low temperature solder paste has a melting temperature below approximately 200 degrees Celsius.

Example 23 may include the subject matter of any of Examples 11-22, and may further include wherein applying the low temperature solder paste comprises applying the low temperature solder paste at a thickness of approximately 100 microns.

Example 24 may include the subject matter of any of Examples 11-23, and may further include wherein the low temperature solder paste comprises tin-bismuth (SnBi) (Sn42Bi58) alloy suspended in an aqueous medium.

Example 25 may include the subject matter of any of Examples 11-24, and may further include wherein the compute component package comprises a ball grid array (BGA) package, a quad flat no lead (QFN) package, or a leadless chip carrier (LCC) package.

Example 26 is an apparatus including a compute component; and a plurality of structures provided on a surface of the compute component, wherein the plurality of structures are to be used to attach and electrically couple the compute component to another device, and wherein a structure of the plurality of structures includes first and second portions, the second portion disposed further from the surface than the first portion, and the first portion to comprise a different metallurgy composition then the second portion.

Example 27 may include the subject matter of Example 26, and may further include wherein the compute component comprises a processor, central processing unit (CPU), graphic processing unit (GPU), memory, controller, interface, circuity, integrated circuit chip, printed circuit board (PCB), motherboard, chipset, or wireless device.

Example 28 may include the subject matter of any of Examples 26-27, and may further include a package for the compute component, wherein the package comprises a ball grid array (BGA) package, a quad flat no lead (QFN) package, or a leadless chip carrier (LCC) package.

Example 29 may include the subject matter of any of Examples 26-28, and may further include wherein the first portion comprises tin-silver-copper (SnAgCu) (SAC) alloy and at least a portion of the second portion comprises tin-copper-bismuth (SnCuBi) intermetallic compound.

Example 30 may include the subject matter of any of Examples 26-29, and may further include wherein the first portion comprises tin-copper (SnCu) alloy and at least a portion of the second portion comprises tin-copper-bismuth (SnCuBi) intermetallic compound.

Example 31 may include the subject matter of any of Examples 26-30, and may further include wherein a shape of the first portion is different from a shape of the second portion.

Example 32 may include the subject matter of any of Examples 26-31, and may further include wherein the first portion comprises a spherical, a semi-spherical, or a flat lead shape.

Example 33 may include the subject matter of any of Examples 26-32, and may further include wherein the second portion comprises a spherical, a columnar, a cylindrical, a polygonal, a rectangular, a square, or an octagonal shape.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

We claim:

1. An apparatus comprising:
   a plurality of structures provided on a surface of a compute component package, wherein the plurality of structures are to be used to attach and electrically couple the compute component package to another device, wherein a structure of the plurality of structures includes first and second portions, wherein the first portion is disposed between the surface and the second portion, wherein the second portion comprises one of: a tetrahedron or an octagonal prism,
   and wherein, the first portion comprises tin-copper (SnCu) alloy and at least a portion of the second portion comprises tin-copper-bismuth (SnCuBi) intermetallic compound.

2. The apparatus of claim 1, wherein the compute component package comprises a ball grid array (BGA) package, a quad flat no lead (QFN) package, or a leadless chip carrier (LCC) package.

3. The apparatus of claim 1, wherein a shape of the first portion is different from a shape of the second portion.

4. An apparatus comprising:
 a compute component; and a plurality of structures provided on a surface of the compute component, wherein the plurality of structures are to be used to attach and electrically couple the compute component to another device, wherein a structure of the plurality of structures includes first and second portions, wherein the first portion is disposed between the surface and the second portion, wherein the second portion comprises one of: a tetrahedron or an octagonal prism,
 and wherein, the first portion comprises tin-silver-copper (SnAgCu)(SAC) alloy and at least a portion of the second portion comprises tin-copper-bismuth (SnCuBi) intermetallic compound.

5. The apparatus of claim 4, wherein the compute component comprises a processor, central processing unit (CPU), graphic processing unit (GPU), memory, controller, interface, circuity, integrated circuit chip, printed circuit board (PCB), motherboard, chipset, or wireless device.

6. The apparatus of claim 4, wherein a shape of the first portion is different from a shape of the second portion.

7. The apparatus of claim 4, wherein the first portion comprises a spherical, a semi-spherical, or a flat lead shape.

\* \* \* \* \*